US005225831A

United States Patent [19]

Osborn

[11] Patent Number: 5,225,831

[45] Date of Patent: Jul. 6, 1993

[54] JOYSTICK AND CONTROL CIRCUIT THEREFOR

[76] Inventor: Jeffrey S. Osborn, 41 Ressor Dr., St. Louis, Mo. 63135

[21] Appl. No.: 710,098

[22] Filed: Jun. 4, 1991

[51] Int. Cl.[5] ..................... H03M 11/00; G05G 9/00; H01H 21/00

[52] U.S. Cl. .............................. 341/20; 74/471 XY; 273/438; 200/6 A

[58] Field of Search ............. 341/20; 340/709, 825.78; 74/471 XY; 200/6 A; 273/438, 148 B; 338/128

[56] References Cited

U.S. PATENT DOCUMENTS

| | | | |
|---|---|---|---|
| 4,181,827 | 1/1980 | Diepeveen | 200/6 A |
| 4,520,355 | 5/1985 | Mitch | 340/709 |
| 4,552,360 | 11/1985 | Bromley et al. | 340/709 |
| 4,884,070 | 11/1989 | Hannaford | 340/825.78 |
| 4,926,172 | 5/1990 | Gorsek | 341/20 |

*Primary Examiner*—Donald J. Yusko
*Assistant Examiner*—R. Gray
*Attorney, Agent, or Firm*—Haverstock, Garrett & Roberts

[57] ABSTRACT

A joystick and associated circuit including a joystick handle and angularly oriented opposed pairs of first and second switches positioned apart from each other on respective axes, the switches being selectively actuatable by movements of the handle, and a resistive path connected to each pair of opposed switches between an operating voltage source and an output terminal, each resistive path providing selected resistance to the respective output terminal which is representative of corresponding movements of the handle, each resistive path including resistive elements connected between the operating voltage source and the respective output terminal, activation of the switches causing the resistance of the respective resistive path to be altered to provide different resistive values to the output terminal. The invention also includes an adjustable centering apparatus and other switches and associated resistors connected into the circuit to establish different combinations of resistance and resistance values between the voltage source and the respective output terminal.

1 Claim, 4 Drawing Sheets

JOYSTICK AND CONTROL CIRCUIT THEREFOR

BACKGROUND OF THE INVENTION

The present invention relates to a joystick for inputting information into a computer for controlling the operation of electronic games or the like and more particularly to a joystick which utilizes digital switches in combination with a resistive network to digitally present analog information to the computer or electronic game.

Joysticks are used in various applications such as to input information into a computer or to control the movement of a figure or object in a video game. The joystick usually includes a handle to facilitate manual input of coordinate information to the video game with the handle being movable to an position in two orthogonal directions to control the input of coordinate information. Currently joysticks either present digital or analog information to the electronic game.

Typically digital joysticks provide digital information to the video game by movement of a handle which is adapted to contact at least one of four switches usually spaced 90° apart. The four switches represent movement of the handle in the +x, −x, +y, and −y directions of an X-Y coordinate system. The handle of the joystick can also be moved to inbetween positions in the coordinate system in order to contact two adjacent switches. This means that the digital joystick has eight possible different switching positions and one position where none of the switches are contacted. The switches are either opened or closed by movements of the handle as will be explained.

The output of the digital joystick in each position is inputted to the computer or game which polls the state of the various switches to determine the position of the handle and what response or condition is to be produced. The switches can be considered to correspond to separate bits of an eight bit register. When the register is read the computer processes the data to be one of many different combinations corresponding to the various positions of the handle of the joystick.

Although the digital joystick is easy to control one disadvantage associated with its use is that it is not able to provide variable information to the computer. For example, with a digital joystick the computer can only interpret each input in a particular way such as turn left or turn right or go up or go down because the digital joystick does not have the ability to provide variable or multifacited input information to the computer, such for example as turn left slowly or turn left part way.

Analog joysticks on the other hand, by their very nature, provide analog information to the video game. A typical analog joystick has a handle which is mechanically coupled to the wiper arms of respective potentiometers. Movement of the handle varies the impedance of the potentiometers, which movements may correspond to movements of a figure in a video game or produce some other change. Analog joysticks also have centering mechanisms, such as tension springs, which return the joystick handles to their center or home positions. Some analog joysticks have a zero adjustment mechanism which calibrates the resistance of the potentiometer to correspond to the center or home position.

The analog joystick is often connected to a game card of a computer. The game card produces digital pulses having durations proportional to the resistance ($R_{in}$) provided from the potentiometers of the analog joystick. The duration of the pulse has an output which is typically 24.2 microseconds $+(0.011 \times R_{in})$ microseconds. For example, in the center or home position, where $R_{in}$ equals 50,000 ohms, the game card will produce a pulse on the order of 574.2 microseconds. This value will be compared to other values to determine the position of the joystick in its various deflected positions. If the next pulse is longer in duration than the previous pulse the computer will determine that the joystick has been moved, for example, in the +x direction. The full scale end points of the joystick (i.e., the joystick being moved all the way to the −x direction where $R_{in}$ equals 0 ohms or all the way to the +x direction where $R_{in}$ equals 100,000 ohms) will cause the game card to output pulses having durations of 24.2 microseconds and 1124.2 microseconds, respectively. The duration of the pulse is compared to other values stored in the computer memory to determine the relative position of the joystick handle in either the x or y directions.

Typically the outputs of analog joysticks are used to control video game action in one of two modes. The first mode, known as the arcade mode, is only concerned with the direction in which the joystick handle is moved. The arcade mode uses the analog joystick as if it were a digital joystick. The arcade mode compares the output of the joystick to a point halfway between the center position and the end points. This provides the computer with three distinct output regions on each axis, namely, left region, center region, and the right region in the case of the x axis.

The second mode, known as the variable mode, is concerned with the amount the joystick handle is moved from its center position. If the joystick is moved a small amount from its center position this will have a correspondingly small effect on the program. On the other hand, if the joystick is moved to an end position, the joystick will have a greater and usually more dramatic effect on the program. The variable mode is used in flight simulation programs to allow varying control of the aircraft.

The analog joystick is capable of providing a variable output to the analog game card. Although the analog joystick provides variable information to the analog game card, the handle itself is difficult to control thus reducing any benefits attributable to variable input information. Another problem associated with the use of the analog joystick is that the center or home resistive value often becomes out of calibration due to inferior centering mechanisms. The centering mechanism of the typical analog joystick mechanically centers the handle of the joystick and the potentiometer wiper to which the handle is connected. Such centering mechanisms for joysticks usually are inaccurate and the resistive value of the center position is also allowed to vary from one setting to the next causing the analog game card which receives the inputs to misinterpret the position of the handle. For these and other reasons it would be advantageous to have a joystick which has the advantages of both a digital and an analog joystick with none of their attendant disadvantages.

SUMMARY OF THE INVENTION

The joystick of the present invention includes a handle and comprises in the x and in the y directions or axes first and second switches positioned apart from each other in each direction or axis, the switches being selectively operable by movements of the handle, and the invention includes a resistor path connected between an operating voltage source and a x or y output terminal, the resistance of the resistor paths varying the resistive values presented to the respective output terminals with movements of the joystick handle.

The resistor path for each direction or axis includes first and second resistors or resistor portions with opposite end terminals and a center terminal. Each resistor path also has a pair of switches which are selectively actuatable to vary the resistance between the end terminals. Actuation of the switches is under control of movements of the joystick in each direction such as the X or Y directions. If neither of the switches is actuated only one resistor or resistor portion is in each path so that half of the total resistance will be connected into the circuit.

If one of the switches in each axis is actuated it will cause both of the resistor portions to be connected in series between the voltage source and the respective output so that the entire resistance will be in the circuit. If the other switch of the set is actuated a short circuit will be connected across both resistor portions or zero resistance will be in the circuit. Variations and refinements of the circuit are disclosed in this application and involve combinations and refinements of the same basic construction and operation.

A principal object of the present invention is to provide means including a joystick operable to improve the control over an analog system such as a computer game.

Another object is to teach the construction and use of a digital joystick that produces improved control over a circuit such as a computer game or other computer program controlled by a joystick.

Another object is to increase the versatility of a digital joystick by using it to control an analog system.

Another object is to increase the ability of the operator of a joystick to maintain control over the operations produced thereby and to provide the operator greater selectivity in the speed of producing movements on a computer of an image moved under control of the joystick.

Another object is enable selection from among a plurality of operating modes in controlling the movements of an image on a computer monitor.

Another object is to increase the accuracy and controlability of an analog system by providing a joystick that is able to provide different selectable resistance variations on each side of a center or neutral position.

Another object is to make it easier to control a computer game or game like program and to prevent sudden, sharp hard to control changes in the movements of a character or image on a computer monitor.

Another important object is to improve the accuracy of the centering of a joystick as compared to more conventional mechanically centered joysticks.

Another object is to allow centering potentiometer knobs to be used as game paddles.

Another object is to increase the flexibility of an analog system by enabling use of a joystick that is easier to use and control.

Another object is to increase the enjoyment and options available to a person controlling the operation of a computer by manipulating a joystick.

Another object is to improve the overall variations in control information that can be provided to a computer controlled by a joystick.

Another object of the invention is to provide a joystick which has a centering mechanism that can be used to calibrate the joystick when the handle of the joystick is in its center or home position and which is adjustable to establish a center or home position anywhere within the resistive range.

Another object is to make control of a computer by a joystick more precise, more enjoyable and more variable.

Another object is to make joysticks easier to use.

These and other objects and advantages of the present invention will become apparent after considering the following detailed specification of preferred embodiments in conjunction with the accompanying drawings, wherein:

DETAILED DESCRIPTION OF PREFERRED EMBODIMENTS

Figure 1:
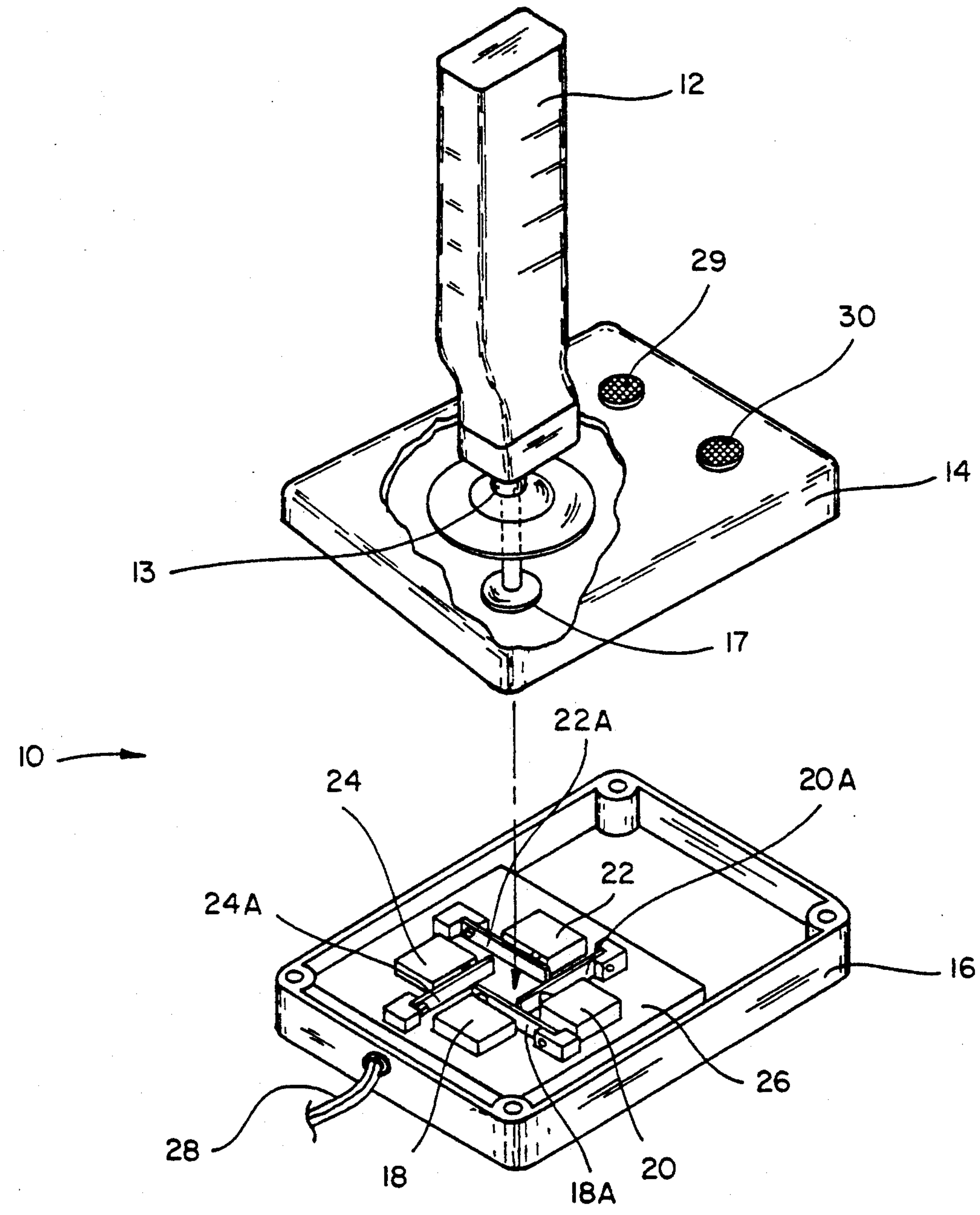
FIG. 1 is an exploded perspective view of a joystick constructed according to the present invention.

One form of joystick for use with the present invention is shown generally as numeral 10 in FIG. 1. The joystick 10 includes a handle 12 pivotally mounted in a swivel socket 13 in an upper housing portion 14. The upper housing 14 is connected to a lower housing 16 by suitable means such as threaded members (not shown). The handle 12 is adapted to be manually manipulated to move or pivot in any direction about the swivel 13 to produce different movements of the control or operator portion 17 which moves substantially in the plane of an X-Y coordinate system. The handle 12 is the portion that is manipulated by the operator and the portion 17 is the portion that makes contact with the movable portions or straps 18A, 20A, 22A and 24A of switches such as single pole double throw (SPDT) microswitches 18, 20, 22, and 24. The switches 18–24 are shown mounted on a circuit board assembly 26 located in the lower housing 16. The circuit board assembly 26 has connections from the respective switches 18–24 via cable or cable strap 28 to a computer or video game. The joystick 10 may also include operator actuable firing buttons 29 and 30 which when pressed control or activate other switches which send signals to the computer or game to initate an event such as the firing of a gun and so forth. The joystick handle 12 is normally maintained in a center or home position which is the position when the portion 17 is not contacting any of the switch actuator straps 18A–24A.

The switches 18–24 are shown spaced 90° apart from each other around the joystick portion 17 in much the same manner as a digital joystick, and the handle 12 can be operated to move the portion 17 into contact with the switch actuators 18A–24A one at a time or simultaneously in the case of the actuator strap of any two adjacent switches 18–24. The joystick 10 is therefore capable of producing eight distinct switching positions plus the home or center position.

Figure 2:
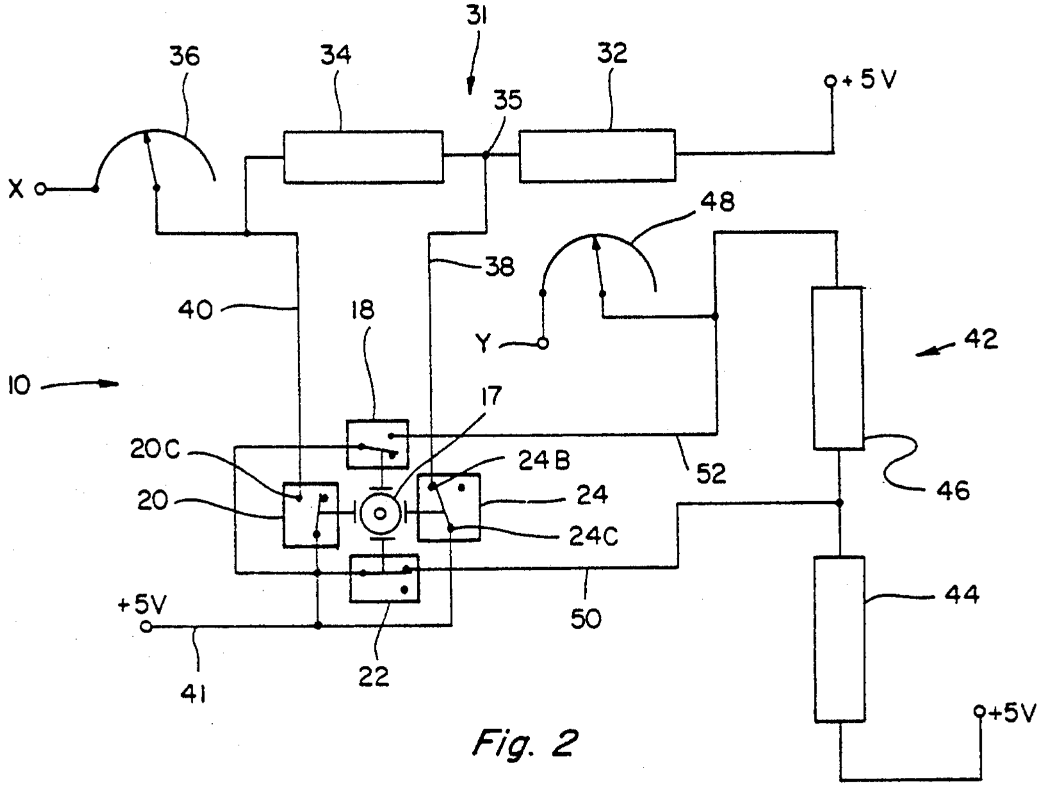
FIG. 2 is a schematic block diagram of one form of circuit under control of the joystick of FIG. 1.

The switches 20 and 24 in FIG. 2 are shown connected to a resistor network 31 that operates to provide analog signals to the computer or video game at an X output terminal. These signals represent the x-axis coordinate information. The resistive network 31 includes a pair of resistors 32 and 34 connected in series between a source of voltage shown as +5V source and a centering potentiometer 36. The circuit 31 also has a center terminal 35 which is positioned between the resistors 32 and 34, and the terminal 35 is connected by lead 38 to the normally closed stationary contact 24B of the switch 24.

The common connection between the resistor 34 and potentiometer 36 is connected by lead 40 to the normally open stationary contact 20C of the switch 20. The movable contacts of the switches 20 and 24 are connected by lead 41 to the +5V source.

The circuit 31 as shown in FIG. 2 with the actuator portion 17 of the handle 12 in the center or neutral position, removes the resistor 32 from the circuit, and only the resistors 34 and 36 are connected between the +5V source and the X terminal. In this position half, or nearly half, of the total resistance of the circuit 31 is connected in the circuit between the +5V source and the X terminal. However, the actual position of the image being controlled on the monitor can be centered or moved off center by adjusting the potentiometer 36.

If the handle 12 is moved to a position where the portion 17 actuates the switch 24, and opens it, the entire resistance of the resistors 32 and 34 as well as the potentiometer 36 will be connected between the +5V source and the output terminal at X. This position of the handle 12 represents the maximum amount of resistance that can be in the circuit 31, subject again to possible adjustment of the potentiometer 36.

If the handle 12 is moved to the position where the switch 20 is activated by the handle portion 17, the switch 20 will move from its open to its closed condition and in this position the +5V source will be connected through the switch 20 and lead 40 to the connection between the potentiometer 36 and the resistor 34. In this condition there is no resistance in the circuit 31 except for the resistance of the potentiometer 36. Thus it can be seen that the handle portion 12 can be moved from one extreme in the +x direction to the opposite extreme in the −x direction and in so doing will move from a condition of maximum to minimum resistance.

The purpose of the potentiometer 36, as indictated, is to provide a convenient means for centering the resistance of the circuit 31 to establish a desired center or neutral condition. This also establishes the center position for the image whose position is controlled by the joystick. Centering is accomplished independent of the actual position of the handle portion 12 and is dependent upon the adjustment of the potentiometer 36. The center resistive value presented by circuit 31 is fixed and only adjustment of the potentiometer 36 is available. Additionally, adjustment of the end points is accomplished by adjustment of potentiometer 36.

The circuit shown in FIG. 2 includes a similar circuit arrangement 42 for control movements in of the Y direction or along the y axis. The circuit 42, like the circuit 31, includes series connected resistors 44 and 46, a potentiometer 48, a +5V source at one end of this circuit, and a Y output terminal at the opposite end. The circuit 42 operates in the same manner as the circuit 31 except that it uses the switches 18 and 22 instead of the switches 20 and 24 to produce the desired outputs.

It is also possible with the circuit shown in FIG. 2 to move the handle into a position where two adjacent switches such as the switches 20 and 22 are actuated together. When this occurs the effect is to produce a condition in the circuit 31 that is similar to the condition when the switch 20 is actuated by itself and a condition in the circuit 42 when the switch 22 is actuated by itself. Thus with the switches 20 and 22 both actuated by the handle portion 17, conditions will be established to send both X and Y outputs to the computer or video game to control some operation such as the movement of a character on a video screen or other monitor along a diagonal. It can thus be seen that there are eight different operating positions for the handle 12 including four where individual switches are actuated and four where two adjacent switches are simultaneously actuated and another position where none of the switches are actuated. This means that the center position for the control can be moved to any position on the monitor simply by adjusting the potentiometers 36 and 48. It is important to understand that the potentiometers 36 and 48 provide an easy to operate accurate means for establishing the mid-points or mid-resistances of the circuits 31 and 42. This is to be contrasted with conventional mechanical centering devices which are difficult to accurately control and do not provide the same high degree of the precise adjustment obtainable by the means disclosed in FIG. 2.

Thus it can be seen that actuation of the switch 20 by itself produces an output corresponding to the −x direction of movement, actuation of switch 24 by itself produces an output corresponding to the +x direction, actuation of switch 22 by itself produces an output that corresponds to the −y direction, and actuation of switch 18 produces an output that corresponds to the +y direction. Actuations of two adjacent switches as described above produces two outputs that corresponds to a diagonal or 45° direction of movement determined by the two switches that have been actuated. The location of the switches as shown in FIG. 2 is selected for ease of understanding. In an actual device the locations of the switches may be opposite from the direction they control depending upon whether you are looking down on or up at the switch arrangement. In all positions of the handle the analog game card or computer will see a resistance that depends upon the condition of the switches and the settings of the potentiometers 36 and 48. The analog game card or computer will also be provided a continuous resistance at all times. This is important because if a continuous resistance is not presented then the analog game card or computer may not recognize that a joystick is connected to it. It is also contemplated that in all cases the analog game card or computer may be constructed and programmed to interpret the signals in an analog or digital format and the signals produced have durations proportional to the resistive values presented thereto.

It should also be noted that when the switches 18–24 are actuated they direct the resulting operating voltage to an appropriate portion of the resistor networks 31 or 42 and then to the respective output terminals X or Y or both as the case may be.

The centering potentiometers 36 and 48 not only allow for centering the home position of the joystick itself but also enable the home position to be adjusted or moved to some desired position on the video monitor being used in association therewith from which the other operations of the joystick will take place. For example, if the character to be controlled is to be located near to one side or one corner of the monitor the potentiometers 36 and 48 can be adjusted accordingly thereby making normal operation of the joystick function around the new center position. Thus the subject joystick and its associated circuitry substantially expands the operation and enjoyment of certain computer operations including computer game operations and makes adjustment and operation easier.

Additionally, the centering potentiometers 36 and 48 could be used to simulate a game paddle. This is accomplished by not moving the handle portion 12 and only adjusting one or both of the centering potentiometers 36 and 48.

Figure 3:
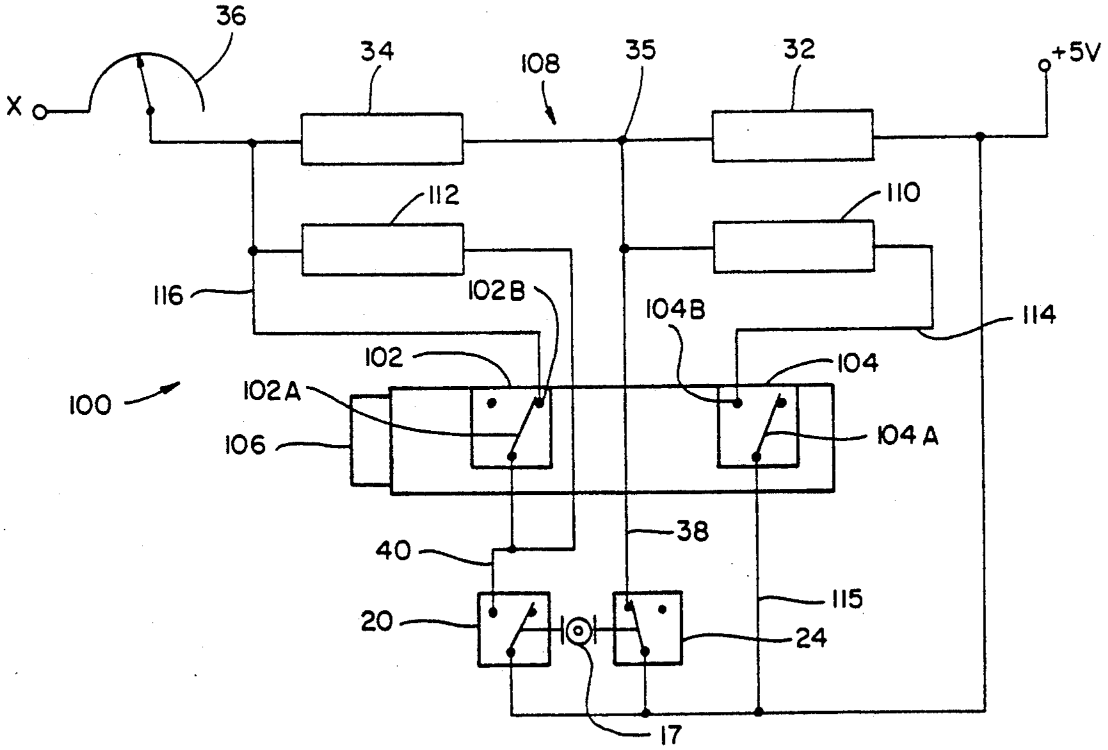
FIG. 3 is a schematic block diagram of the control circuit for controlling one axis or direction of movement of the subject joystick.

FIG. 3 shows the x axis circuitry for another embodiment 100 of the present invention. It should be realized, however, that similar circuitry will also be provided for controlling the y axis movement. The numbering used in FIG. 3 corresponds to the extent possible to the numbering of the x portion of the circuitry shown in FIG. 2. The embodiment 100 includes a joystick handle 12 which controls movements of the portion 17 in the manner described above. The circuit of FIG. 3 also includes two additional switches 102 and 104 which are operated in unison by a push button control 106 which is shown in its depressed or actuated condition with the operating or movable contacts 102A and 104A of the switches 102 and 104 in their transferred positions. The x axis switches 20 and 24 and the associated switches 102 and 104 are connected to a resistor network 108 which includes resistors 32 and 34 connected as described above in connection with FIG. 2 and other resistors 110 and 112 connected as shown. The resistor 110 has one end connected to neutral or center terminal 35 and the opposite end is connected by lead 114 to the normally closed stationary terminal 104B of the switch 104. The movable contact 104A of the switch 104 is connected by lead 115 to the +5V source. The resistor 112 has one end connected to switch 20 and the opposite end is connected between lead 116 and the potentiometer 36. Lead 116 is connected to the normally open stationary terminal 102B of the switch 102.

When the switch 24 is in its normally closed position, switch 20 is in its normally opened position, and switch 104 is in its normally opened position because the button 106 is depressed, as shown, the resistor 34 and potentiometer 36 will be in the circuit between the +5V source and the x terminal. If, on the other hand, the switch 24 is in its transferred open position due to operation of the handle 12, at a time when the switch 104 is in its opened condition when the button 106 is depressed, then the resistors 32 and 34 will be connected in series with the potentiometer 36 between the +5V source and the x terminal. If, on the other hand, the switch 102 is in its normally closed position due to the button 106 being depressed and switch 20 is transferred due to operation of the handle 12, its transferred position will close the switch 20 thereby placing only the potentiometer 36 in the circuit between the +5V source and the x terminal.

When the push button 106 is released to return to its deactivated condition opening the switch 102 and closing switch 104 the operation of the circuit is different from the circuit shown in FIG. 1. With the push button 106 in its deactivated or left position the movable contacts 102A and 104A of the switches 102 and 104 are both in their leftward positions.

When the switch 24 is in its normally closed position, switch 20 is in its normally opened position, and switch 104 is in its normally closed position due to the button 106 being released, the resistor 34 and potentiometer 36 will be in the circuit between the +5V source and the x terminal. If, on the other hand, the switch 24 is in its transferred open position due to operation of the handle 12, at a time when the switch 104 is in its closed condition because the button 106 is released, then the resistors 32 and 110 will be connected in parallel and this parallel combination will be connected in series with the resistor 34 and the potentiometer 36 between the +5V source and the x terminal. By the same token, the switch 102 will be in its normally opened position due to the button 106 being released so that if the switch 20 is transferred due to operation of the handle 12, its transferred position will close the switch 20 thereby placing the resistors 34 and 112 in parallel and this parallel combination will be in series with the potentiometer 36 in the circuit between the +5V source and the x terminal.

With the circuits shown in FIG. 3 it is therefore possible to have many different variations and combinations including the extreme +x, +y, −x and −y conditions as well as inbetween values of x and y in either direction as well as the neutral position depending upon the position of the handle 12 and the condition of the push button 106. Thus with the circuit shown in FIG. 3, as stated, it is possible to provide additional variations including additional resistance variations in the operation of the device. The selection of particular values for the resistors 32, 34 and 110 and 112 together with the setting of the potentiometers makes it possible to provide many different variations including many different resistor circuit combinations to thereby increase the ability of the operator to control the computer program or game involved. This means that the push button 106 provides an important additional means to change the values of the resistances and resistance combinations that are available to be placed in the circuit and hence also varies the resistances presented to the computer or game card as seen between the +5V source and the terminal x of the subject joystick control circuit. The push button 106 therefore changes the operating mode of the circuit and enables operation in full scale in either direction and in a half or other partial scale operation in either direction, and enables the user of the joystick to select between fast and slow control over the game or other program being played or controlled.

Figure 4:
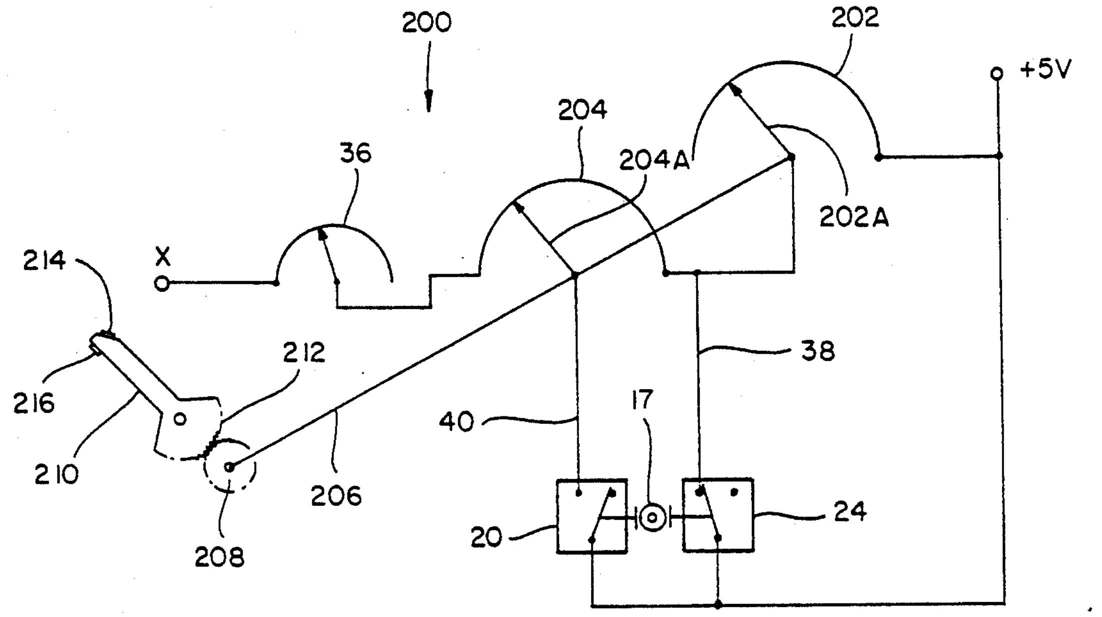
FIG. 4 is a schematic block diagram of another embodiment of the circuit for controlling the same axis of the subject joystick.

FIG. 4 shows another embodiment 200 of the subject joystick control circuit controllable by a joystick having a handle 12 and a portion 17 movable to actuate switches as aforesaid. FIG. 4, like FIG. 3, only shows the x control and it is to be understood that a y control will also be needed to control operation in the various necessary directions. The joystick control circuit 200 includes two x axis switches 20 and 24 similar to those discussed above. The circuit also includes three (3) adjustable potentiometers 202, 204 and 36. The variable resistors or potentiometers 202 and 204 have movable contacts connected to a common shaft 206 which has a gear 208 mounted on it. The gear is engaged by a second gear 212 which has a control handle portion 210 which may also include a pair of fire buttons 214 and 216 which enable the operator to control certain firing operations of the game, if necessary. The operator using the construction shown in FIG. 4 uses one hand to control the handle 210, the second gear 212 and the firing control buttons 214 and 216, and uses the other hand to control the joystick in a manner similar to that described above.

The control handle 210 adjusts the resistance values of the variable resistors or potentiometers 202 and 204 by changing the position of the shaft 206 and the movable contacts 202A and 204A of the variable resistors 202 and 204. Operation of the joystick handle 12 and the control portion 17 is similar to that discussed above in connection with FIG. 1, the main difference being that potentiometers or variable resistors are used instead of fixed resistors such as the resistors 32 and 34 described above. Therefore, operation of the control handle 210 adjusts the values of the potentiometers 202 and 204 which are connected between the +5V source and the output terminal x. This means that when the joystick handle 12 is moved to actuate the switch 20 only portions of the potentiometers 204 and 36 are in circuit between the +5V souce and the output terminal x. The game card thus sees the resistor value on the left side of the variable resistor or potentiometer 204 as shown in FIG. 4 plus a portion of the resistance of the potentiometer 36.

If neither of the switches 20 or 24 is actuated, the game card will see with the full resistance of the potentiometer 204 plus the offset or centering resistance of the potentiometer 36. If the switch 24 is actuated and opened by operation of the handle 12, the game card will see the full resistance of the variable resistors 204 plus a portion of the resistance of the centering potentiometer 36 and a portion of the resistance of the potentiometer 202 depending on its settings. This is similar to what was described above in connection with the construction shown in FIG. 1. The advantage of the construction 200 is that it provides means for adjusting the values of the resistances presented between the +5V source and the x terminal as the handle 210 is being manipulated. This provides a wide range of variable resistance adjustment and it does so in association with the operation of a joystick such as described.

Figure 5:
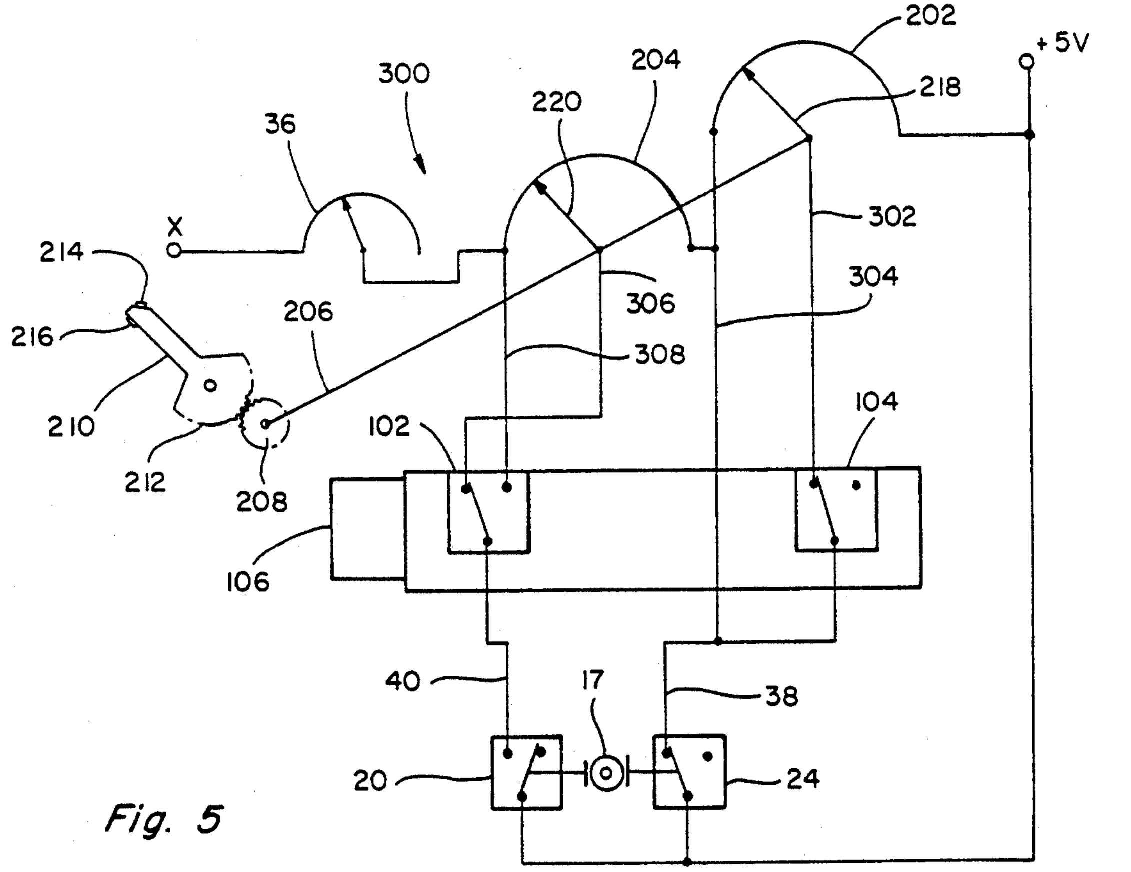
FIG. 5 is a schematic block diagram of yet another embodiment of the circuit for controlling the same axis the subject joystick.

Another embodiment 300 of the subject joystick and associated circuitry is shown in FIG. 5. This embodiment incorporates the teachings of FIG. 4 with the teachings of FIG. 3. In other words FIG. 5 makes use of the ability to adjust the resistance on either side of the center position with the provision of a push button control such as the push button 106 shown and described in connection with FIG. 3. The operation of the push button 106 allows the circuit of FIG. 5 to be switched between variable scale and full scale modes. The operation of the circuit of FIG. 5 is similar to the operation of the circuit in FIG. 3 but using potentiometers instead of fixed resistors. In FIG. 5 the connections made between the switches 24 and 104 and between the switches 20 and 102 are provided by leads 38 and 40, and other connections between the switches and the potentiometers 202, 204 and 36 are made by leads 302, 304, 306 and 308 as shown.

Figure 6:
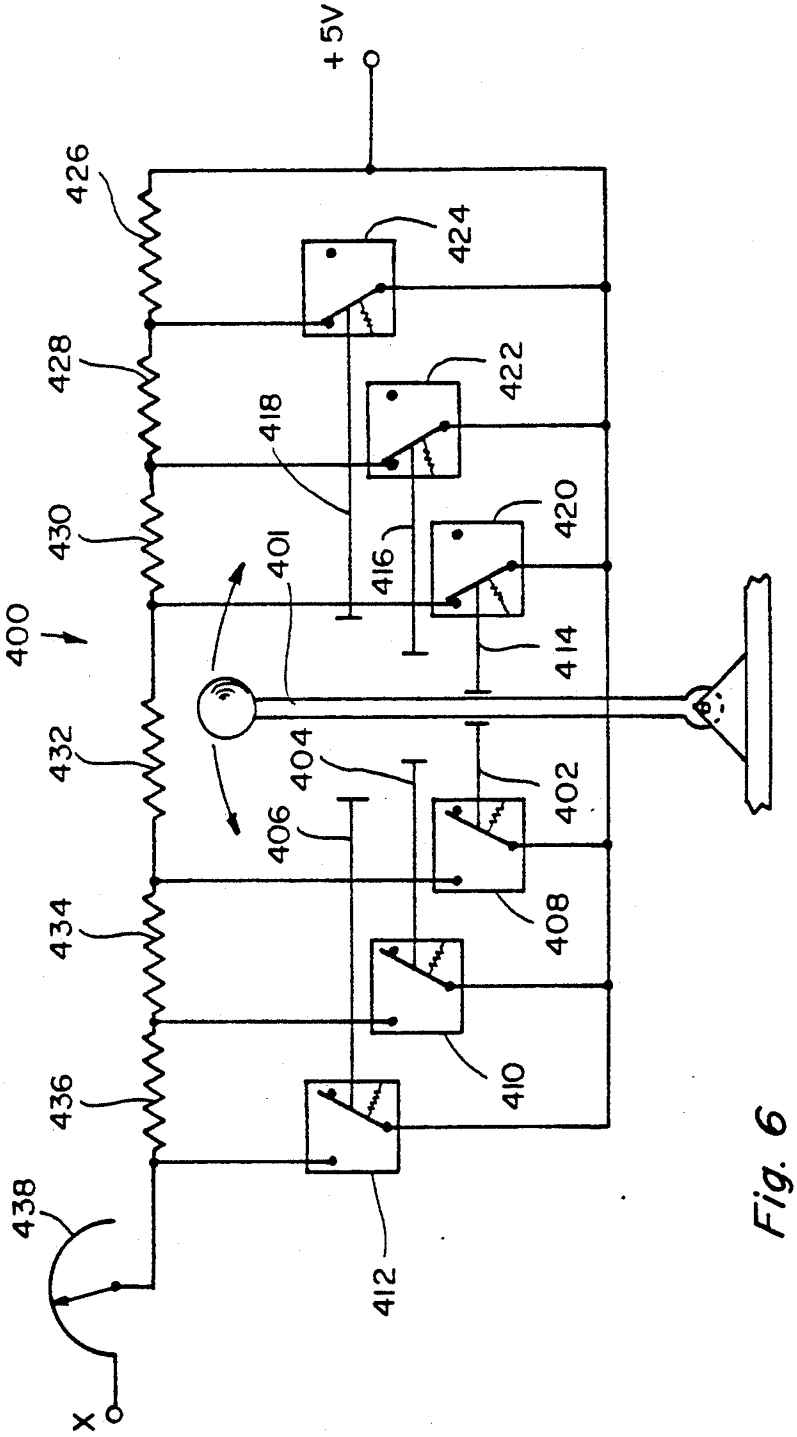
FIG. 6 is a schematic circuit diagram of still another embodiment of the circuit for the subject joystick.

FIG. 6 shows another embodiment 400 of the subject joystick and the associated circuit. In this case, which shows the x axis portion only, the joystick is operable to provide a number of selected resistor increments connected between the +5V source and the x output. A similar circuit will be provided for the y component. In the construction 400 the joystick handle 401 is pivotal about one end and is constructed to move, in order, the operator members 402, 404 and 406 of their normally open switches 408, 410 and 412 in the −x direction. Slight movement to the left will close to switch 408, more movement to the left will close the switch 410 and still more leftward movement will close all three of the switches 408, 410 and 412. In like manner movements of the joystick 401 to the right will cause contact, in order, with switch operation members 414, 416 and 418 of normally closed switches 420, 422 and 424 which are in the +x direction. In this case the switches will open instead of close when actuated. Each of the switches 408, 410, 412, 420, 422 and 424 has a connection to a different position in a series resistor network made up of resistors 426, 428, 430, 432, 434 and 436 connected between a +5V source and the x output terminal. This circuit also has a centering potentiometer 438 connected as shown. In each position of the joystick a different amount of resistance is in the circuit and when the joystick 401 is in its center position the three resistors 432, 434 and 436 plus the centering potentiometer 438 are in the circuit. This arrangement provides a large measure of variable resistive or speed control using a joystick.

As the joystick is moved further to the left or right the speed of the control being effected will be increased. Additional switches may be added to the circuit shown in FIG. 6 to increase the speed of the control being effected. Similar movements can be implemented in the y direction using similar circuitry. The circuit of FIG. 6 can also be used with variable resistive elements and/or a push button control such as described above.

Thus there has been shown and described several different embodiments of a control circuit for use with a joystick and other control means which fulfill all of the various objects and advantages sought therefor. It will be apparent to those skilled in the art, however, that many changes, modifications, variations and other uses and applications for the subject joystick and associated circuit are possible and contemplated. All such changes, modifications, variations and other uses and applications which do not depart from the spirit and scope of the invention are deemed to be covered by the invention which is limited only by the claims which follow.

What is claimed is:

1. A joystick for operating a computer and the circuitry associated therewith comprising:

a joystick including an elongated operator member and a swivel mounting therefor about which the operator member is pivotal, and sets of opposed switches arranged at spaced locations about the operator member, each switch in each set having a switch operator member actuatable by predetermined movement of the elongated operator member, and each switch having a movable switch member movable by the switch operator member and spaced stationary terminals engagable by the movable switch member, each set of opposed switches includes at least four switches arranged in equal numbers of switches on opposite sides of the elongated operator member, the switch operators of the switches of each set being positioned such that they are actuated in succession as the elongated operator member is moved in the direction thereof, such that more of the switches of a set are actuated the further the elongated operator member is moved in the direction thereof, the circuit including a similar resistor network connected to each set of opposed switches, each network having a plurality of resistor elements connected in series with a potentiometer between a voltage source and an output terminal, selected ones of the resistor elements of the plurality of resistor elements being capable of being switched into or out of the circuit by actuation of selected ones of the switches in the respective set whereby, actuation of different combinations of the switches of each opposed set of switches establishing a different predetermined combination of the plurality of resistors in series with the corresponding potentiometer between the voltage source and the corresponding output terminal.

* * * * *